_(12)_ United States Patent
Ito et al.

(10) Patent No.: US 9,190,501 B2
(45) Date of Patent: Nov. 17, 2015

(54) SEMICONDUCTOR DEVICES INCLUDING A LATERAL BIPOLAR STRUCTURE WITH HIGH CURRENT GAINS

(71) Applicant: Broadcom Corporation, Irvine, CA (US)

(72) Inventors: Akira Ito, Irvine, CA (US); Kenneth Yau, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/800,063

(22) Filed: Mar. 13, 2013

(65) Prior Publication Data
US 2014/0239451 A1  Aug. 28, 2014

Related U.S. Application Data

(60) Provisional application No. 61/769,577, filed on Feb. 26, 2013.

(51) Int. Cl.
*H01L 29/66* (2006.01)
*H01L 29/735* (2006.01)
*H01L 29/08* (2006.01)
*H01L 29/739* (2006.01)

(52) U.S. Cl.
CPC .......... *H01L 29/735* (2013.01); *H01L 29/0808* (2013.01); *H01L 29/0821* (2013.01); *H01L 29/6625* (2013.01); *H01L 29/739* (2013.01)

(58) Field of Classification Search
USPC .......................... 257/565, 369, 370, 574, 322
See application file for complete search history.

(56) References Cited

U.S. PATENT DOCUMENTS

| | | | |
|---|---|---|---|
| 2003/0062539 A1* | 4/2003 | Chatterjee | 257/199 |
| 2005/0127445 A1* | 6/2005 | Ker et al. | 257/355 |
| 2008/0179686 A1* | 7/2008 | Chen et al. | 257/369 |
| 2010/0027172 A1* | 2/2010 | Liu et al. | 361/56 |
| 2010/0155819 A1* | 6/2010 | Ogoshi et al. | 257/324 |
| 2010/0244143 A1* | 9/2010 | Yang et al. | 257/370 |
| 2012/0049282 A1* | 3/2012 | Chen et al. | 257/347 |

OTHER PUBLICATIONS

Chen, Shuo-Mao, et al., "*A High Current Gain Gate-Controlled Lateral Bipolar Junction Transistor with 90 nm CMOS Technology for Future RF SoC Applications*", Solid-State Electronics, vol. 52, (2008), pp. 1140-1144.
Chen, Shuo-Mao, et al., "*A Low-Flicker Noise Gate-Controlled Lateral-Vertical Bipolar Junction Transistor Array With 55-nm CMOS Technology*", IEEE Transactions on Electron Devices, vol. 58, No. 10, (2011), pp. 3276-3281.
Chung, T-W., et al., "*A 2.7GHz 3.9mW Mesh-BJT LC-VCO With -204dBc/Hz FOM in 65nm CMOS*", Chung, T-W., et al., "*A 2.7GHz 3.9mW Mesh-BJT LC-VCO With -204dBc/Hz FOM in 65nm CMOS*", Custom Integrated Circuits Conference (CICC) (2012), 4p.

* cited by examiner

*Primary Examiner* — Bilkis Jahan
(74) *Attorney, Agent, or Firm* — Brinks Gilson & Lione (57) ABSTRACT

A semiconductor device includes an emitter region, a collector region and a base region. The emitter region is implanted in a semiconductor substrate. The collector region is implanted in the semiconductor substrate. The base region is disposed between the emitter region and collector region. The base region includes no more than one LDD region and no more than one halo region. The base region contacts directly with at least one of the emitter region and the collector region.

20 Claims, 6 Drawing Sheets

SEMICONDUCTOR DEVICES INCLUDING A LATERAL BIPOLAR STRUCTURE WITH HIGH CURRENT GAINS

CROSS REFERENCE TO RELATED APPLICATIONS

This application claims the benefit of pending U.S. Provisional Application No. 61/769,577, filed Feb. 26, 2013, the entirety of which is incorporated herein by reference.

TECHNICAL FIELD

This disclosure relates generally to semiconductor devices. More particularly, it relates to fabrication methods and semiconductor device including a lateral bipolar structure.

BACKGROUND

Silicon semiconductor processing has evolved sophisticated operations for fabricating integrated circuits. An integrated circuit may include an interconnected array of active and passive elements, such as transistors, resistors, capacitors, and inductors, integrated with or deposited on a substrate by a series of compatible processes.

A bipolar junction transistor (BJT or bipolar transistor) is a type of transistor that relies on the contact of two types of semiconductor for its operation. BJTs may be used as amplifiers, switches, or in oscillators. BJTs may be found either as individual discrete components, or in large numbers as parts of integrated circuits.

BRIEF DESCRIPTION OF THE DRAWINGS

The disclosed method and apparatus may be better understood with reference to the following drawings and description. In the figures, like reference numerals designate corresponding parts throughout the different views.

DETAILED DESCRIPTION

The operation of bipolar transistors generally involves both electrons and holes. These two kinds of charge carriers are characteristic of the two kinds of doped semiconductor material. In contrast, unipolar transistors such as the field-effect transistors have only one kind of charge carrier. Charge flow in a BJT is due to bidirectional diffusion of charge carriers across a junction between two regions of different charge concentrations. A BJT includes three regions called emitter, collector, and base. A discrete transistor has three leads for connection to these regions. By design, most of the BJT collector current is due to the flow of charges injected from a high-concentration emitter into the base where they are minority carriers that diffuse toward the collector, and so BJTs are classified as minority-carrier devices.

In communication systems, there is an increasing stringent requirement for in-band phase noise of oscillators. BJT may be a potential candidate to solve this problem because of its low flicker noise. CMOS-compatible bipolar devices such as lateral and vertical BJTs have been considered while their popularity is prevented by their relatively larger sizes and lower current gains.

This disclosure presents a novel structure that can be fabricated using a sub-30 nm manufacturing process. For example, the structure may be used to fabricate a complementary metal-oxide-semiconductor (CMOS) or a BJT using a 20 nm process or a 28 nm process. The fabricated BJTs have low 1/f noise and very high current gains.

Figure 1:
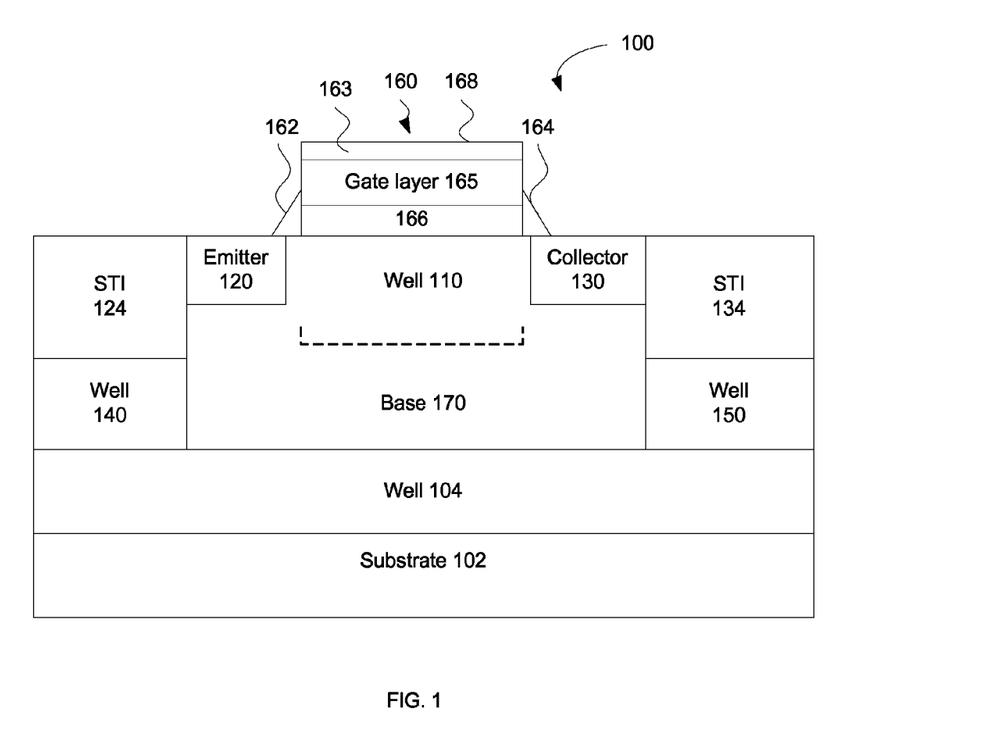
FIG. 1 shows a cross-sectional view of a semiconductor device according to a first exemplary embodiment.

FIG. 1 shows an example of a cross-sectional view of a semiconductor device 100 according to a first exemplary embodiment. The semiconductor device 100 may be an NPN device formed from an n-type metal oxide semiconductor (NMOS) structure or a PNP device formed from a p-type metal oxide semiconductor (PMOS) structure. The semiconductor device 100 includes an emitter region 120 and a collector region 130. The emitter region 120 is implanted in a semiconductor substrate 102. The collector region 130 is also implanted in the semiconductor substrate 102. The semiconductor device 100 further includes a base region 170 between the emitter region 120 and the collector region 130. The base region 170 includes a well 110. The well 110 may be a P well in an NPN device.

The semiconductor substrate 102 may be a p-type substrate made of p-type material. The p-type material may be obtained by a doping process by adding a certain type of atoms to the semiconductor in order to increase the number of positive carriers (holes). Alternatively, the semiconductor substrate 102 may be an n-type substrate. The well 110 may be formed by implanting a first material having a first conductivity type into the substrate 102. The wells 140 and 150 may be formed by implanting a second material having a second conductivity type into the substrate 102. In an NPN device, the first material may be a p-type material such as boron or other suitable materials. The second material may be an n-type material such as phosphorous, arsenic, or other suitable materials.

For example, in an NPN device, the emitter region 120 and the collector region 130 are doped with an n-type material and the base region 170 is doped with a p-type material. In a PNP device, the emitter region 120 and the collector region 130 are doped with a p-type material and the base region 170 is doped with an n-type material.

In FIG. 1, the base region 170 contacts directly with the emitter region 120 and the collector region 130. In other words, the right edge of the emitter region 120 and the left edge of the collector 130 completely touch the base region 170. The base region 170 does not include a halo region or a lightly doped drain (LDD) region between the emitter 120 and the collector 130. Without the halo region or the LDD region, the fabricated semiconductor device 100 has a better performance with a higher current gain value.

The semiconductor device 100 includes a shallow trench isolation (STI) region 124 on the well 140 and adjacent to the emitter region 120. The semiconductor device 100 includes a STI region 134 on the well 150 and adjacent to the collector region 130. The STI region 124 may include a dielectric material, such as $SiO_2$ or other suitable material. The STI region 124 provides isolation and protection for the NMOS structure.

The semiconductor device 100 further includes a gate structure 160 disposed on the base region and between the emitter region 120 and the collector region 130. The gate structure 160 has a gate upper surface 168. The gate structure 160 is disposed on the well 110. The gate upper surface 168 is higher than the emitter region 120 and the collector region 130.

The gate structure 160 includes a gate silicide layer 163, a gate layer 165, and a gate oxide layer 166. The thickness of 163 is between 10 nm and 20 nm. The gate structure 160 may be located between two spacers 162 and 164. The spacers are typically a dielectric material, such as $SiO_2$, though any suitable material can be used. The gate layer 165 is on top of the gate oxide layer 166. The gate silicide layer 163 is on top of the layer 165. The gate silicide layer 163 may include an alloy of metal and silicon. The semiconductor device 100 may include other silicide layers on top of the emitter region 120 or on top of the collector region 130. One use of silicide layers is to form a low resistance interconnection between other devices with the semiconductor device 100.

The device 100 may also include a well 104 implanted on the substrate 102 and under the wells 110, 140, and 150. The well 104 may be a deep N well doped with n-type material.

Figure 2:
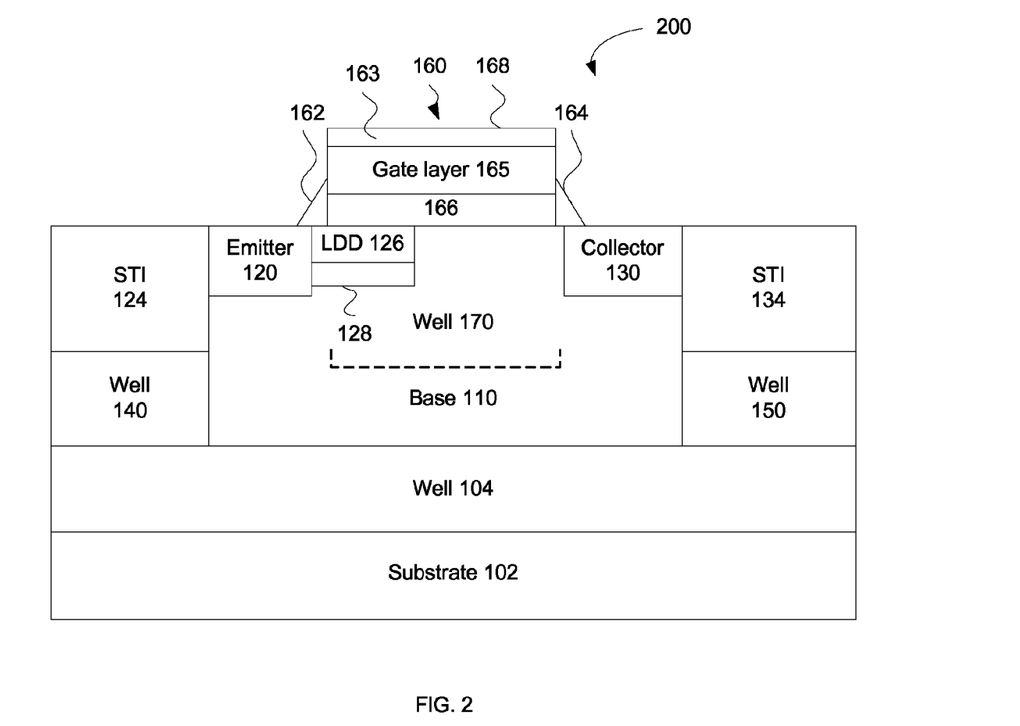
FIG. 2 shows a cross-sectional view of a semiconductor device according to a second exemplary embodiment.

FIG. 2 shows a cross-sectional view of a semiconductor device 200 according to a second exemplary embodiment. One of the differences between the device 100 and the device 200 is that the base region 170 includes a LDD region 126 and a halo region 128. The LDD region 126 is disposed under the gate structure 160 and on the halo region 128. For example, in a PNP device, the LDD region is doped with p-type material in the ranges of $5\times10^{17}$ $cm^{-3}$ to $5\times10^{18}$ $cm^{-3}$, which means that there are about $5\times10^{17}$ to $5\times10^{18}$ p-type material atoms per cubic centimeter. The halo region in a PNP device may have a concentration of n-type material in the ranges of $5\times10^{17}$ $cm^{-3}$ to $5\times10^{18}$ $cm^{-3}$, which similarly means that there are about $5\times10^{17}$ to $5\times10^{18}$ n-type material atoms per cubic centimeter. In a NPN device, the LDD region is doped with n-type material in the ranges of $5\times10^{17}$ $cm^{-3}$ to $5\times10^{18}$ $cm^{-3}$ and the halo region in the NPN device may have a concentration of p-type material in the ranges of $5\times10^{17}$ $cm^{-3}$ to $5\times10^{18}$ $cm^{-3}$. Both the LDD region 126 and the halo region 128 are disposed adjacent to the emitter 120. In the device 200, the left edge of the collector 130 directly and completely touches the base region 170.

Figure 3:
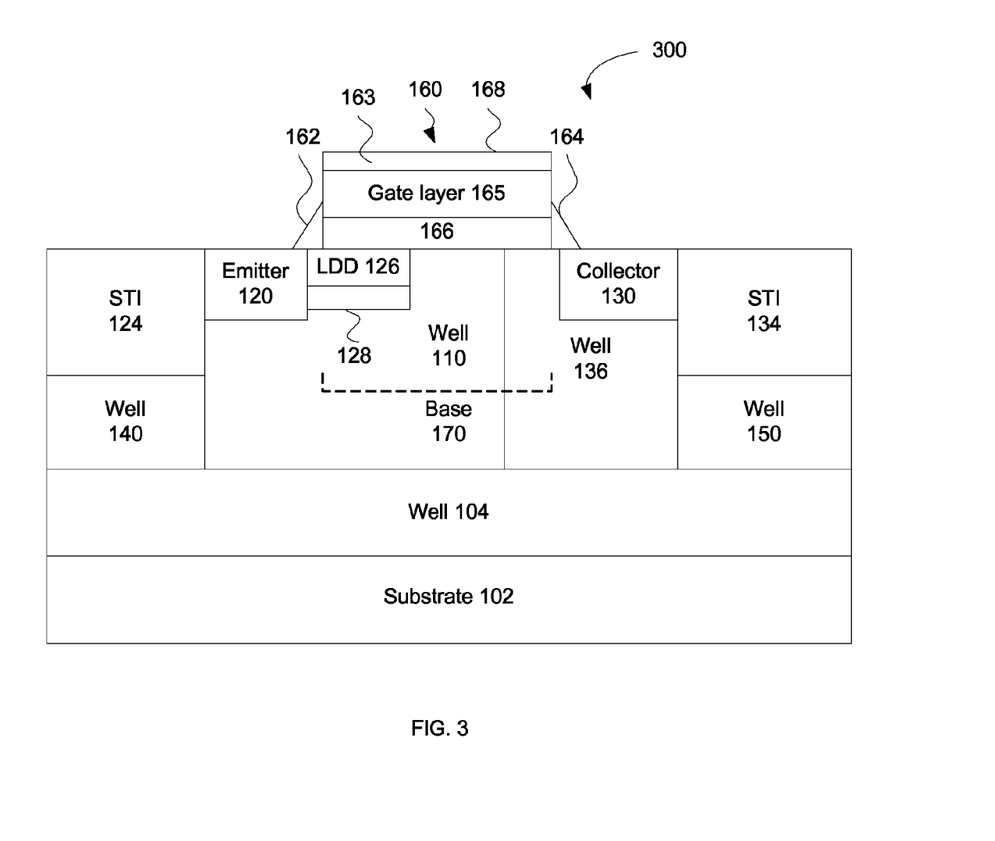
FIG. 3 shows a cross-sectional view of a semiconductor device according to a third exemplary embodiment.

FIG. 3 shows a cross-sectional view of a semiconductor device 300 according to a third exemplary embodiment. One of the differences between the device 200 and the device 300 is that the device 300 further includes a L-shaped well 136 in the base region 170 adjacent to the collector 130. The L-shaped well 136 is disposed partially under the collector 130 and partially under the gate structure 160. The well 136 may be doped with material that has the same conductivity as the material in the collector 130. For example, in a NPN device, the well 136 is an N well doped with n-type material.

Figure 4:
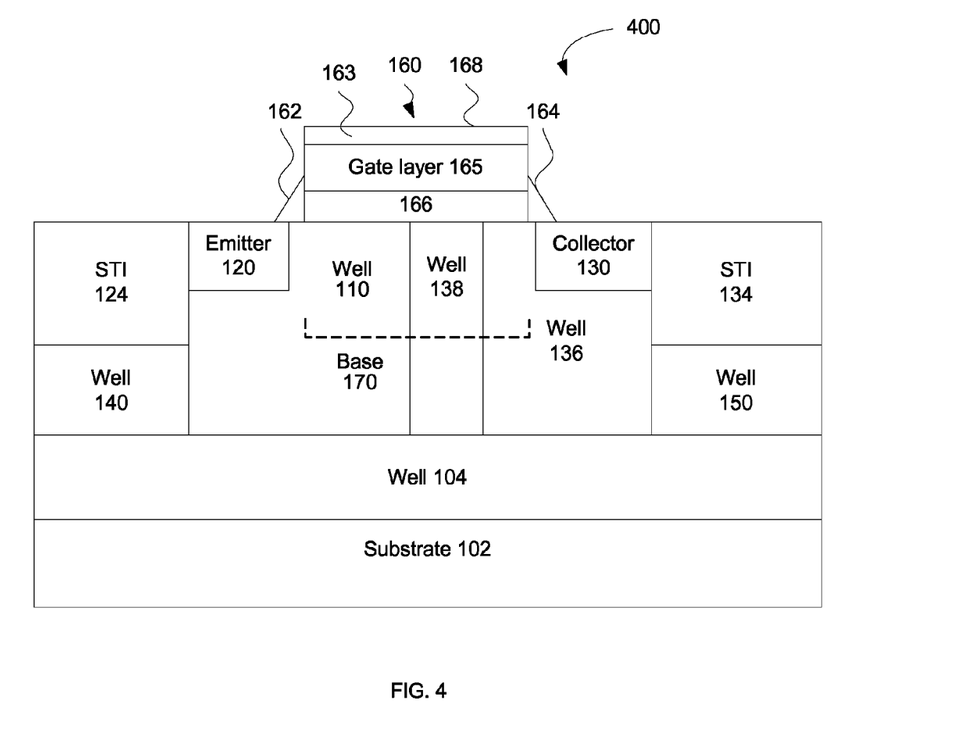
FIG. 4 shows a cross-sectional view of a semiconductor structure according to a fourth exemplary embodiment.

FIG. 4 shows a cross-sectional view of a semiconductor device 400 according to a fourth exemplary embodiment. One of the differences between the device 300 and the device 400 is that the base region 170 further includes a layer 138 adjacent to the L-shaped well 136 and under the gate structure 160. The layer 138 may be a lightly-doped substrate layer.

Figure 5:
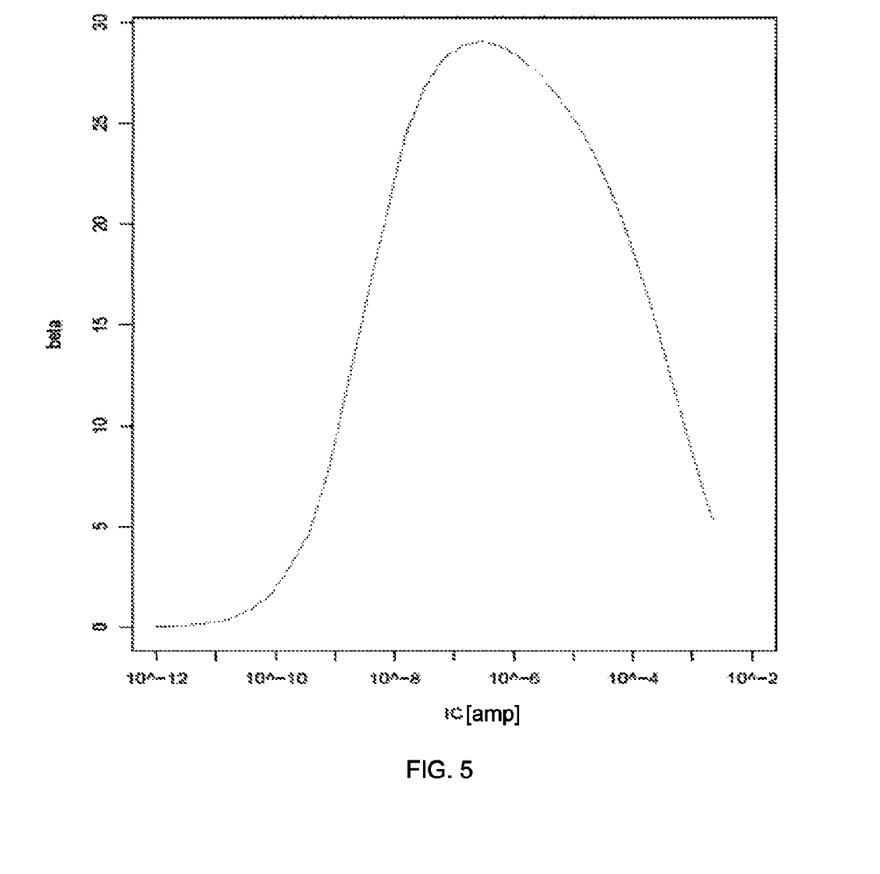
FIG. 5 shows a plot of current gain under different collector currents of a semiconductor structure according to an exemplary embodiment.

FIG. 5 shows a plot of current gain under different collector currents of a semiconductor device according to an exemplary embodiment. The current gain changes smoothly when the collector current increases from $10^{-12}A$ to $10^{-2}A$. The maximum current gain is around 30 when the collector current is around $10^{-6}A$. Generally, the base width, which is the distance between emitter and collector, is around 0.01 µm to 0.1 µm. The maximum current gain is reached when the semiconductor device has a base width around 0.1 µm. The maximum current gain may be further increased by adjusting the base width.

Figure 6:
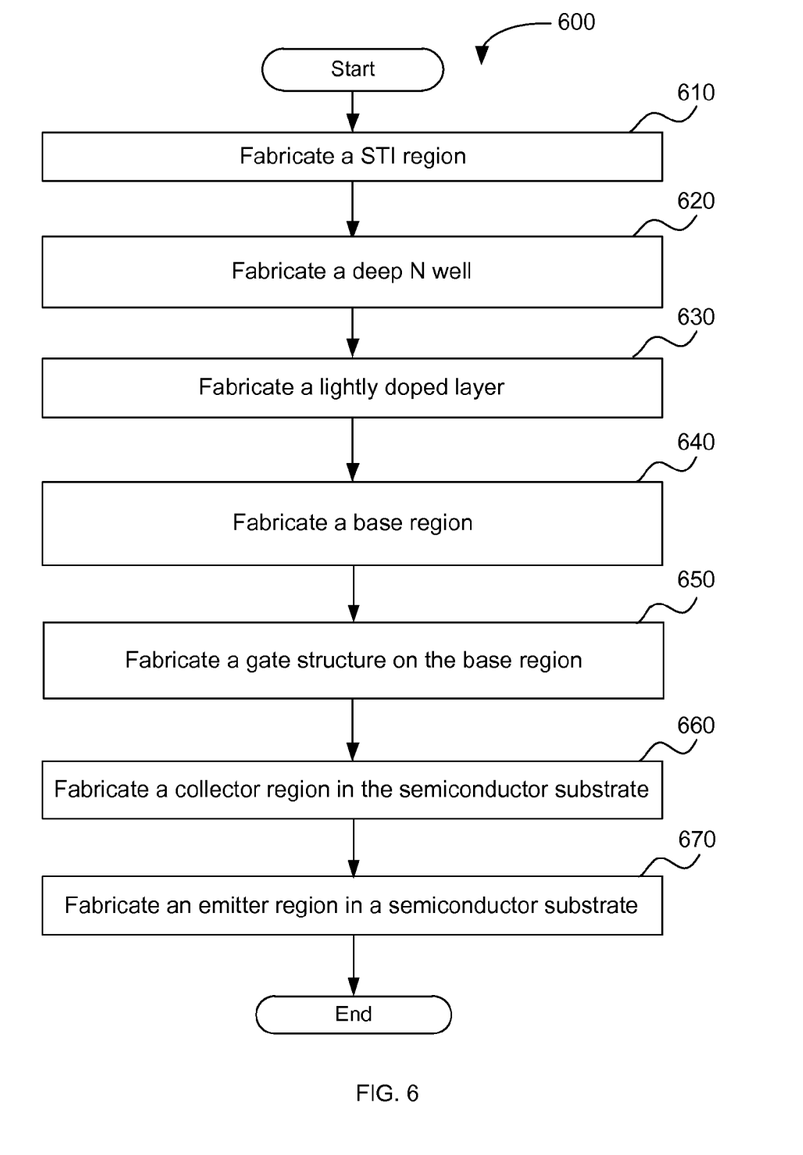
FIG. 6 shows an exemplary method to manufacture a semiconductor device.

FIG. 6 shows an exemplary method to manufacture a semiconductor device. In general, the disclosed semiconductor devices may be fabricated using a sub-30 nm manufacturing process. The method 600 is for illustration only, and the processes described below do not have to be carried out in the described order. Also, other fabrication steps may be introduced.

In the fabrication process 600, a STI region is fabricated by etching semiconductor regions in a semiconductor substrate (610). This may include depositing an etched semiconductor substrate with a dielectric material such as $SiO_2$, though any suitable material can be used, to form shallow trench isolation regions. For example, fabricating a STI region 124 adjacent to the emitter region 120 and on the well 140 and another STI region 134 adjacent to the collector region 130 and on the well 150 provides isolation and protection to the semiconductor device 400. Forming additional STI regions may increase the breakdown voltage of the device.

A deep N well is fabricated by implanting a semiconductor substrate with an appropriate impurity to form a deep N well (620). This may include implanting an n-type material into the substrate 102 in FIGS. 1-4. The formed deep N well 104 is disposed under the base region 170 as shown in FIGS. 1-4. In FIG. 3, the deep N well 104 is under the wells 140, 110, 136, and 150. In FIG. 4, the deep N well 104 is also under the layer 138 and the wells 140, 110, 136, and 150.

A lightly doped layer is fabricated by blocking p-well implant between two wells having different types of conductive material (630). This step may further include implanting a layer of p type material between the P well 110 and the N well 136. The fabricated lightly-doped substrate layer is adjacent to the collector as illustrated in FIG. 4.

A base region is fabricated between the emitter region and the collector region by implanting a conductive material into the semiconductor substrate (640). This may include implanting the semiconductor device with a conductive material that has a different type of conductivity as the emitter region and the collector region. For example, the fabricated base region has a p-type material in NPN device and an n-type material in a PNP device.

A gate structure is formed by fabricating at least one semiconductor substrate on the base region (650). This may include depositing polysilicon on top of the whole semiconductor structure and etching the polysilicon to define a gate region partially on the base region and between the emitter and the collector. This may include implanting a semiconductor substrate with polycrystalline silicon, though any suitable material can be used, on top of a gate oxide to form the gate structure. The gate may be doped with appropriate impurity depending on the application purpose. The gate may be formed by high K dielectric and the gate is formed by a work function metal with additional suitable layer of materials.

A collector region is fabricated by implanting a conductive material into the semiconductor substrate (660). This may include implanting a semiconductor substrate with an appropriate impurity to form an n-type emitter in a NPN device or a p-type emitter in a PNP device. In FIGS. 1-4, the collector region 130 is fabricated adjacent a second STI region 134. The emitter and the collector have the same conductivity types. For example, both the emitter and the collector may have a p-type material or an n-type material.

An emitter region is fabricated by implanting a conductive material into a semiconductor substrate (670). This may include implanting the semiconductor substrate with an appropriate impurity to form an n-type emitter in a NPN device or a p-type emitter in a PNP device. In FIGS. 1-4, the emitter region 120 is fabricated adjacent a first STI region 124. For example, implanting the substrate with phosphorous or arsenic, both n-type materials, forms the n-type emitter, while implanting the substrate with boron, a p-type material, forms the p-type emitter.

A spacer may be fabricated by depositing a dielectric material such as $SiO_2$ on top of a semiconductor substrate to form spacers. This may include fabricating a spacer on a side of polysilicon or dummy polysilicon of the gate structure after implanting an LDD partially under the gate structure. The spacer is adjacent to the gate structure. For example, one spacer is adjacent to the source structure and in contact with the gate structure and separate the gate structure from the source structure. The other spacer is adjacent to drain structure and in contact with the gate structure and a STI region and separates the gate structure from the raised drain structure.

The method may further includes forming a silicide layer that includes depositing metal on top of poly silicon and then alloy to create silicide, though any suitable material can be used, on top of the gate, the emitter, and the collector of the semiconductor device to form the connection between the fabricated device and a metallization layer. The metallization layer forms the interconnections between the fabricated device and other devices.

The disclosed semiconductor device does not have two halo region or LDD region. In one embodiment, the semiconductor device has a single halo region and a single LDD region in the base region. The base region contacts directly with at least one of the emitter region and the collector region. In other embodiments, the semiconductor device does not include a single halo region or a single LDD region in the base region. The fabricated devices have better performances with high current gains.

The embodiments disclose are for illustrative purposes only, and are not limiting. Many other embodiments and implementations are possible within the scope of the systems and methods. Accordingly, the devices and methods are not to be restricted except in light of the attached claims and their equivalents.

What is claimed is:

1. A lateral bipolar transistor, comprising:
an emitter region disposed in a semiconductor substrate, the emitter region having an upper emitter surface;
a collector region disposed in the semiconductor substrate, the collector region laterally disposed along a common surface from the upper emitter surface;
a base region between the emitter region and collector region; and
a first lightly doped drain (LDD) region disposed in the base region and adjacent to the emitter region, the first LDD region disposed directly below a gate structure,
where the base region contacts directly with the collector region without a second LDD region adjacent to the collector region.

2. The lateral bipolar transistor of claim 1, further comprising a halo region disposed in the base region and adjacent to the emitter region.

3. The lateral bipolar transistor of claim 1, further comprising a gate structure disposed on the base region, wherein the gate structure is disposed between a first spacer and a second spacer respectively disposed on the emitter region and the collector region.

4. The lateral bipolar transistor of claim 1, wherein a spacer is disposed adjacent to the emitter region and in contact with the gate structure and separate the gate structure from the emitter region.

5. The lateral bipolar transistor of claim 1, further comprising a N well adjacent to the collector.

6. The lateral bipolar transistor of claim 5, further comprising a deep N well disposed in the semiconductor substrate and directly below the base region.

7. The lateral bipolar transistor of claim 5, wherein the emitter region and the collector region are doped with an n-type material and the base region is doped with a p-type material.

8. The lateral bipolar transistor of claim 7, wherein the emitter region and the collector region are doped with a p-type material and the base region is doped with an n-type material.

9. A lateral bipolar transistor, comprising:
an emitter region disposed in a semiconductor substrate, the emitter region having an upper emitter surface;
a collector region disposed in the semiconductor substrate, the collector region laterally disposed along a common surface from the upper emitter surface;
a base region between the emitter region and collector region;
a gate structure disposed on the base region; and
a halo region below a first lightly doped drain (LDD) region disposed in the base region, the halo region and the first LDD region in direct contact with the emitter, the first LDD region disposed directly below the gate structure without a second LDD region adjacent to the collector region.

10. The lateral bipolar transistor of claim 9, wherein the emitter region and the collector region are doped with an n-type material and the base region is doped with a p-type material.

11. The lateral bipolar transistor of claim 9, wherein the emitter region and the collector region are doped with a p-type material and the base region is doped with an n-type material.

12. The lateral bipolar transistor of claim 9, wherein the gate structure is disposed between the emitter region and the collector region.

13. The lateral bipolar transistor of claim 12, further comprising a N well adjacent to the collector.

14. The lateral bipolar transistor of claim 12, further comprising a deep N well disposed in the semiconductor substrate and directly below the base region.

15. The lateral bipolar transistor of claim 14, wherein an average half-pitch in the lateral bipolar transistor is less than 30 nm.

16. The lateral bipolar transistor of claim 15, wherein the lateral bipolar transistor supports a current gain up to at least 30.

17. A lateral bipolar transistor, comprising:
an emitter region disposed in a semiconductor substrate, the emitter region having an upper emitter surface;
a collector region disposed in the semiconductor substrate, the collector region laterally disposed along a common surface from the upper emitter surface;
a base region between the emitter region and collector region; and
a gate structure on the base region,
wherein:
the base region comprises a first lightly doped drain (LDD) region adjacent to the emitter region, the first LDD region in direct contact with the gate structure without a second LDD region adjacent to the collector region; and the base region comprises an L-shaped well partially under the collector region.

18. The lateral bipolar transistor of claim 17, wherein the gate structure is disposed directly on the L-shaped well.

19. The lateral bipolar transistor of claim 18, wherein the L-shaped well is an N well partially under the gate structure.

20. The lateral bipolar transistor of claim 19, further comprising a shallow trench isolation (STI) region that directly contacts both the L-shaped well and the collector.

\* \* \* \* \*